(12) United States Patent
Mochizuki et al.

(10) Patent No.: US 7,001,819 B2
(45) Date of Patent: Feb. 21, 2006

(54) SEMICONDUCTOR DEVICE AND POWER AMPLIFIER USING THE SAME

(75) Inventors: Kazuhiro Mochizuki, Tokyo (JP); Tohru Oka, Osaka (JP); Isao Ohbu, Sagamihara (JP); Kiichi Yamashita, Shiroyama (JP)

(73) Assignee: Renesas Technology Corp., Tokyo (JP)

( * ) Notice: Subject to any disclaimer, the term of this patent is extended or adjusted under 35 U.S.C. 154(b) by 191 days.

(21) Appl. No.: 10/750,772

(22) Filed: Jan. 5, 2004

(65) Prior Publication Data

US 2004/0140480 A1 Jul. 22, 2004

Related U.S. Application Data

(62) Division of application No. 10/120,505, filed on Apr. 12, 2002, now Pat. No. 6,696,711.

(30) Foreign Application Priority Data

Apr. 20, 2001 (JP) .............................. 2001-121973

(51) Int. Cl.
*H01L 21/8222* (2006.01)
(52) U.S. Cl. ..................................................... 438/312
(58) Field of Classification Search ......... 438/312–321
See application file for complete search history.

(56) References Cited

U.S. PATENT DOCUMENTS

| 5,233,219 A | 8/1993 | Shimoji et al. |
| 5,449,930 A | 9/1995 | Zhou |
| 5,512,496 A | 4/1996 | Chau et al. |
| 5,700,701 A * | 12/1997 | Hill et al. ................... 438/309 |
| 6,133,594 A | 10/2000 | Iwai et al. |

OTHER PUBLICATIONS

"Heterojunction bipolar transistors fo InGaAs system for microwave power amplifier", OYO-BUTURI, vol. 66, No. 2, (1997), pp. 156-160.
Journal of Vacuum Science and Technology, vol. 18, No. 2, 2000, pp. 761-764.
IEEE Electron Device Letters, vol. 21, No. 9, 2000, pp. 427-429.

* cited by examiner

*Primary Examiner*—Richard A. Booth
(74) *Attorney, Agent, or Firm*—Mattingly, Stanger, Malur & Brundidge, P.C.

(57) ABSTRACT

A semiconductor device comprising a plurality of heterojunction bipolar transistors with their base layer made of GaAsSb or InGaAs, a GaAs substrate, and a buffer layer placed between the base layer and the substrate is fabricated. The substrate and the buffer layer that lie directly under the intrinsic regions of a part or all of the plurality of heterojunction bipolar transistors are removed. Thereby, a semiconductor device using HBTs that can operate with a power supply voltage of 2V or below can be provided at reduced cost as a well-reliable product, and a power amplifier with high power conversion efficiency can be provided.

2 Claims, 17 Drawing Sheets

SEMICONDUCTOR DEVICE AND POWER AMPLIFIER USING THE SAME

This is a divisional application of U.S. Ser. No. 10/120,505, filed Apr. 12, 2002.

BACKGROUND OF THE INVENTION

1. Field of the Invention

The present invention relates to a semiconductor device using heterojunction bipolar transistors (hereinafter abbreviated to HBTs) and its fabrication method, and, more particularly, to a power amplifier featuring high power conversion efficiency even when the power supply voltage is 2 V or below and reduced cost of manufacturing thereof.

2. Description of the Prior Art

In recent years, as the demand for mobile communications equipment has been increasing rapidly, the research and development of power amplifiers for use in the communications equipment have been made actively. Semiconductor transistors that are used as the power amplifiers for the mobile communications equipment include GaAs HBTs, GaAs field-effect transistors (hereinafter abbreviated to FETs), and Si MOS (Metal Oxide Semiconductor) FETs. Among them, GaAs HBTs are the most commonly used transistors oriented to the power amplifier for the mobile communications equipment because of the features thereof: good linearity of input-output characteristics, operation on only the positive supply-voltage, for which circuits and components for generating a negative supply-voltage are not required, high output power density, less chip area for mounting, which results in compactness and reduced cost of manufacturing.

For a GaAs HBT, voltage $V_{BE}$ for turning its base-emitter junction on is approximately 1.4 V. If GaAs HBTs are used in a monolithic microwave integrated-circuit (hereinafter abbreviated to MMIC) including bias circuits, as is shown in FIG. 29, power supply voltage $V_{CC}$ of 2.8 V or above is required which is double the $V_{BE}$. As of 2001, power supply voltage that is most usually used in mobile communications equipment is 3.5 V. Thus, there is no problem in using the GaAs HBTs as the power amplifier for mobile communications equipment. In future, however, the power supply voltage for mobile communications equipment is expected to decrease to 2 V or below for reducing the power consumed by the digital circuits included in the equipment. Ultimately, it is inevitable that the supply voltage decreases to 1.5 V that is equivalent to the voltage supplied by a dry cell. In the coming time when lower power supply voltage for mobile communications equipment will be mainstream as described above, a problem should arise that the GaAs HBTs will become unable to be used as the transistors oriented to the power amplifier for mobile communications equipment.

Because the emitter-base turn-on voltage $V_{BE}$ is almost equal to the forbidden bandgap potential of the base material, in order to decrease the $V_{BE}$, InGaAs or GaAsSb that is a narrow bandgap semiconductor should be used as the base material. Heretofore, the study on HBTs with the base of InGaAs (the InAs mole fraction is 0.5) was disclosed in, for example, OYO-BUTURI Vol. 66, No. 2 (1997), pp. 156–160. The study on HBTs with the base of GaAsSb (the BaAs mole fraction is 0.5) was disclosed in, for example, Journal of Vacuum Science and Technology Vol. 18, No. 2 (2000), pp. 761–764. These references reported the $V_{BE}$ measurements of 0.7 V and 0.6 V respectively.

According to the above two references of previous HBT techniques, InP that is lattice-matched to the base material was used as the substrate. However, the InP substrate is more expensive than the GaAs substrate on a same diameter basis and increasing the diameter of the InP substrate is more difficult than for the GaAs substrate. This posed a problem of higher cost of power amplifier manufacturing by these techniques.

In contrast, HBTs with the base of InGaAs, using the GaAs substrate that is less costly and can be made to have a larger diameter were disclosed in IEEE Electron Device Letters Vol. 21, No. 9 (2000), pp. 427–429. As is illustrated in FIG. 27, the feature of these HBTs is that a compositionally graded InGaP buffer layer 2 with a thickness of 1.5 μm exists between the InGaAs HBTs 34 and the GaAs substrate 1. The InGaP buffer layer 2 shuts up dislocation due to lattice-mismatch to the substrate in it so that the dislocation does not extend to the crystalline layers constituting the HBTs.

However, because the thermal resistivity of alloy semiconductors such as, typically, InGaP, is about 10 times as great as that of GaAs, the junction temperature of the InGaAs-base HBTs tends to rise during operation. As the junction temperature rises, the collector current increases, which further rises the junction temperature; that is, positive feedback takes place. In consequence, the so-called thermal runway that collapses the HBTs tends to occur, which results in a significant decrease in reliability of the HBTs and a semiconductor device using the HBTs. To suppress the junction temperature rise, the thickness of the InGaP buffer layer should be 0.1 μm or less, so that the increase of thermal resistivity of the buffer layer will be negligible. However, a 0.1 μm-thick buffer layer cannot prevent dislocation due to lattice-mismatch from extending to the crystalline layers constituting the HBTs. Consequently, when the HBTs are operating, dislocation propagates in the crystalline layers constituting the HBTs, especially, in the base layers, and the density in the carrier-recombination center increases. This causes another reliability problem of current-induced degradation of current gain.

In addition to the above reliability problems, the previous HBT techniques have limitations. In order to increase the power conversion efficiency of a power amplifier with a low power supply voltage, it is necessary to reduce the knee voltage (minimum collector-emitter voltage at the operating collector current density when the HBTs carry a common emitter current for operation) in the current-voltage characteristics. The knee voltage is primarily determined by the sum of the emitter resistance and the collector resistance and these resistances must be minimized. According to the previous HBT techniques, for the HBTs with the emitters up, collector electrodes 25 as illustrated in FIG. 27 are laterally formed on the sub-collector layer 3 which is a semiconductor (for the HBTs with the collectors up, the emitter electrodes instead of the collector electrodes). The collector resistance (emitter resistance) due to the series resistance of the sub-collector layer 3 hindered the knee voltage decreasing. The heretofore reported minimum measurement of the knee voltage (defined at collector current density $2 \times 10^4$ A/cm$^2$) is 0.15 V.

SUMMARY OF THE INVENTION

It is an object of the present invention to provide a semiconductor device using HBTs operable with a power supply voltage of 2 V or below, free of reliability problems and at reduced cost.

It is another object of the present invention to provide a semiconductor device adequate for a power amplifier with high power conversion efficiency.

It is a further object of the present invention to provide a power amplifier with high power conversion efficiency at reduced cost, the power amplifier operating with a power supply voltage of 2 V or below and having no reliability problems.

In order to achieve the foregoing objects and in accordance with the present invention, a semiconductor device is provided in which a GaAs substrate that is less costly and can be made to have a large diameter is used and HBTs with the GaAsSb base layer are fabricated. A buffer layer to absorb dislocation due to lattice-mismatch intervenes between the HBTs and the GaAs substrate. The GaAs substrate and the buffer layer of high thermal resistivity are removed that lie directly under the HBT-intrinsic regions for transistor operation (the effective regions for transistor operation that are those just under the emitter electrodes in the case of HBTs with the emitters up or those just under the collector electrodes in the case of HBTs with the collectors up). The HBTs are fabricated in collector-up configurations. The intrinsic emitters that contribute to transistor operation are made of InAlAs and the extrinsic emitters that do not contribute to transistor operation are made of InAlAs including at least one of elements He, B, O, and F. Furthermore, an emitter electrode of the HBTs is formed so as to cover the back surface of the HBTs device. Using the thus fabricated semiconductor device, a power amplifier is configured.

In a first aspect of the present invention, its feature is a semiconductor device comprising a plurality of heterojunction bipolar transistors with their base layer made of GaAsSb or InGaAs, a GaAs substrate, and a buffer layer placed between the base layer and the substrate, wherein the substrate and the buffer layer that lie directly under the intrinsic regions of a part or all of the plurality of heterojunction bipolar transistors are removed.

In the first aspect of the invention, preferably, a part or all of the plurality of heterojunction bipolar transistors are fabricated in collector-up configurations; their intrinsic emitters are made of InAlAs and extrinsic emitters are made of InAlAs including at least one of elements He, B, O, and F; and an emitter electrode is formed directly under the intrinsic regions of a part or all of the plurality of heterojunction bipolar transistors.

It is preferable that a base electrode of each of the heterojunction bipolar transistors is formed in contact with the top surface and side of its base layer and the surface of its adjacent extrinsic emitter region.

In a second aspect of the present invention, its feature is a power amplifier configured in a monolithic microwave integrated circuit constructed by using the above semiconductor device.

In the second aspect of the invention, it is preferable to configure a power amplifier in a monolithic microwave integrated circuit including the above semiconductor device, capacitors, and resistors.

It is also preferable to configure a power amplifier in a monolithic microwave integrated circuit including the above semiconductor device, inductors, and Schottky diodes.

It is also preferable to configure a power amplifier in a monolithic microwave integrated circuit including the above semiconductor device and heterojunction bipolar transistors fabricated in emitter-up configurations.

In another view of the first aspect of the present invention, its feature is a semiconductor device configured by using a heterojunction bipolar transistor having common emitter current-voltage characteristics in which a collector-emitter voltage is 0.12 V or below at collector current density of $2\times10^4$ A/cm$^2$. It is preferable to configure a power amplifier in a monolithic microwave integrated circuit constructed by using the semiconductor device provided according to another view of the first aspect of the present invention.

In a third aspect of the present invention, its feature is a method of fabricating a semiconductor device comprising a plurality of heterojunction bipolar transistors with their base layer made of GaAsSb or InGaAs, a GaAs substrate, and a buffer layer placed between the base layer and the substrate, the method including a process in which the GaAs substrate is removed to an extent covering the intrinsic regions of the plurality of heterojunction bipolar transistors by photolithography and dry etching and the buffer layer is then removed to the same extent.

In the third aspect of the invention, it is preferable that an emitter electrode is formed to cover the back surface of the semiconductor device finally, following the above process.

DESCRIPTION OF THE PREFERRED EMBODIMENTS

In the present invention, by employing GaAsSb (the GaAs mole fraction is 0.5) or InGaAs (the InAs mole fraction is 0.5) as the base layer, the emitter-base turn-on voltage $V_{BE}$ can be decreased to 0.7 V or below. Consequently, HBTs that can operate even if the power supply voltage decreases to 2 V or below can be fabricated. To fabricate such HBTs, a GaAs substrate and a buffer layer that is thick enough to absorb dislocation due to lattice-mismatch are used. The GaAs substrate and the buffer layer that lie directly under the HBT-intrinsic regions are removed. In this way, a semiconductor device free of reliability problems due to a thermal runway and current-induced degradation of gain can be fabricated at about a tenth of the cost for fabricating a similar device using the InP substrate which is expensive and limited to a small diameter.

Figure 33:
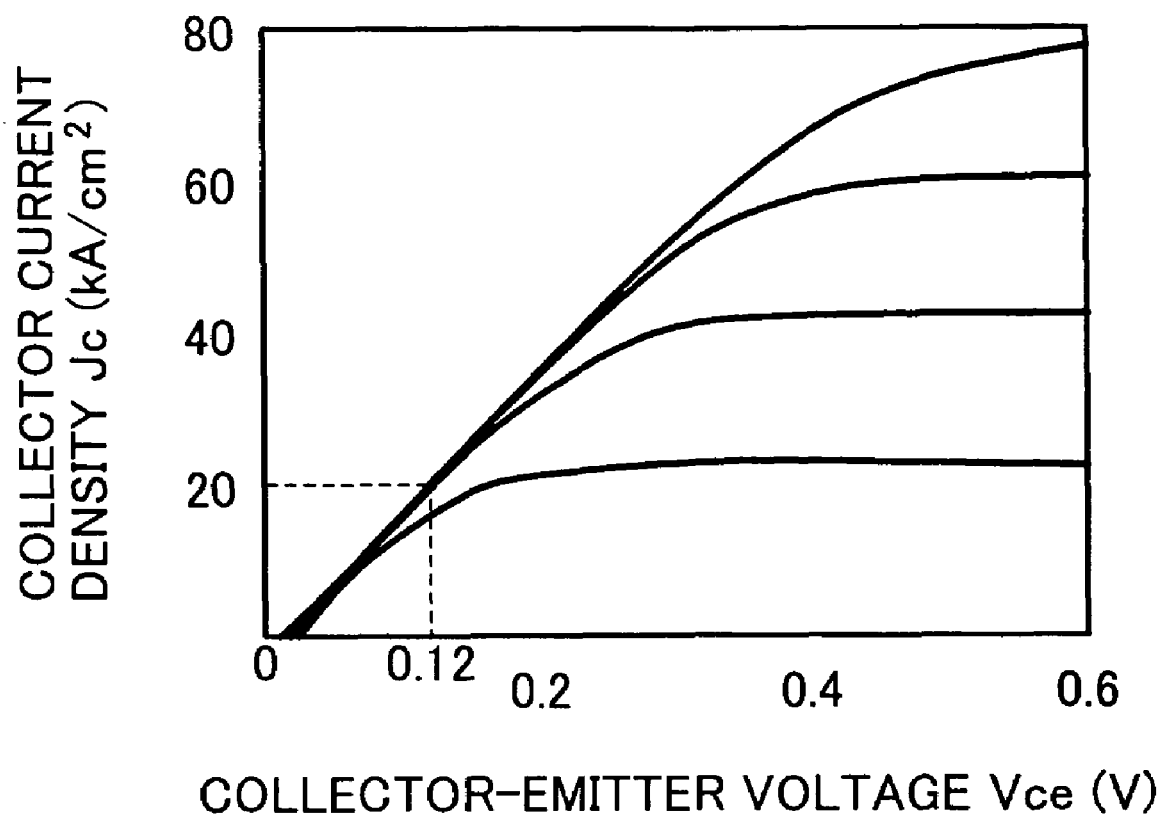
FIG. 33 shows common emitter current-voltage characteristics of the HBTs of the collectors up fabricated, according to Embodiment 1 of the present invention.

In the present invention, an HBT backside electrode is formed in the vacancy made by the removal of the GaAs substrate and buffer layer. Thereby, the collector resistance (for HBTs with emitters up) or emitter resistance (for HBTs with collectors up) due to the resistance of the semiconductor layers, which caused a problem for HBTs fabricated by previous techniques, sufficiently decreased, and enhancing the power conversion efficiency was achieved. This was demonstrated by the common emitter current-voltage characteristics of the HBTs provided by the present invention, as is shown in FIG. 33, wherein the knee voltage is 0.12 V at current density $2 \times 10^4$ A/cm$^2$, which is lower than the minimum knee voltage of 0.15 V measured heretofore.

The above HBT backside electrode may be either a collector electrode (for HBTs with emitters up) or an emitter electrode (for HBTs with collectors up). However, because common-emitter type HBTs are generally used as power elements in a semiconductor device for a power amplifier, it is desirable to fabricate HBTs in collector-up configurations and deposit HBT backside electrode metal to cover the back surface of the GaAs substrate and the HBTs device as a common emitter grounding surface, so that stabilized ground potential and decreased extrinsic emitter inductance are achieved. It is easily implemented that an emitter-up HBT and a collector-up HBT coexist on a same semiconductor device, separated by device isolation regions, which will be described later in a preferred embodiment.

When fabricating HBTs with the collectors up, in order to impede the flow of the base current across the extrinsic emitter-base junction, implantation of ions of helium (He), boron (b), oxygen (O), fluorine (F), or the like has been performed conventionally, using the collector electrodes and collector mesa as masks. This technique for InGaAs HBTs with the collectors up was disclosed in IEEE Electron Device Letters Vol. 11, No. 10 (1990), pp. 457–459. Using the same technique, ion implantation is applied in the present invention such that intrinsic emitters are made of InAlAs and extrinsic emitters that do not contribute transistor operation are made of InAlAs including at least one of elements He, B, O, and F. For HBTs with an InGaAs base layer, however, the above ion implantation is performed after the external base layer is partially removed, as will be described in a preferred Embodiment 2. This is because p-type InGaAs changes to n-type after ion implantation, whereas p-type conductive GaAsSb remains as is after ion implantation when ions of at least one of the above-mentioned elements are implanted during the fabrication process of npn-type HBTs.

In the following, preferred embodiments of the present invention will now be described.

Embodiment 1

Figure 1:
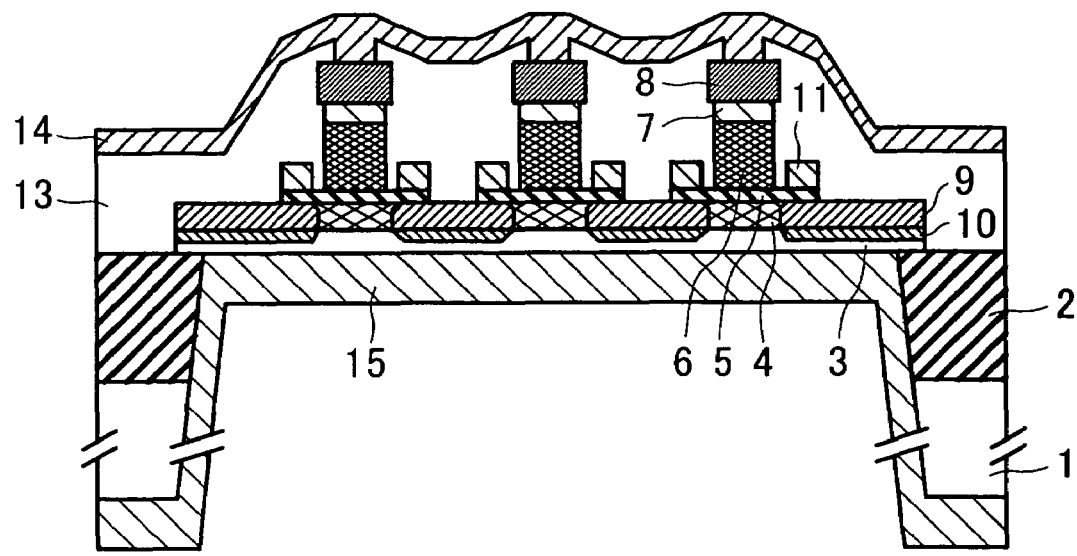
FIG. 1 is a vertical sectional view representing the structure of a semiconductor device using HBTs with the collectors up, which is a preferred Embodiment 1 of the present invention.

FIG. 1 is a vertical sectional view representing the structure of a semiconductor device using HBTs with the collectors up as a preferred Embodiment 1 of the present invention. On a semi-insulating GaAs substrate 1, there exist the following layers: InGaP buffer layer 2 (the InP mole fraction gradually increasing from 0.5 to 1.0, undoped, and 1.5 $\mu$m thick), heavily-doped, n-type InGaAs sub-emitter layer 3 (the InAs mole fraction being 0.5, the Si concentration being $4 \times 10^{19}$ cm$^{-3}$, and 0.6 $\mu$m thick), n-type InAlAs emitter layer 4 (the InAs mole fraction being 0.5, the Si concentration being $5 \times 10^{17}$ cm$^{-3}$, and 0.2 $\mu$m thick) p-type GaAsSb base layer 5 (the GaAs mole fraction being 0.5, the C concentration being $3 \times 10^{19}$ cm$^{-3}$, and 70 nm thick) n-type InP collector layer 6 (the Si concentration being $3 \times 10^{16}$ cm$^{-3}$ and 0.8 $\mu$m thick), n-type InGaAs cap layer 7 (the InAs mole fraction being 0.5, the Si concentration being $4 \times 10^{19}$ cm$^{-3}$, and 0.2 $\mu$m thick). Collector electrodes 8 and base electrodes 11 are non-self-aligned and formed. Of course, the collector electrodes 8 and base electrodes 11 may be self-aligned and formed. In the transistor extrinsic regions of the emitter layer 4 and sub-emitter layer 3 (the regions other than the HBT intrinsic regions just under each collector electrode), there exist a high-resistivity InAlAs extrinsic emitter region 9 and a n-type InAlAs extrinsic sub-emitter region 10. These regions in which boron ions are implanted impede the flow of the base current across the extrinsic emitter-base junction. Instead of the boron ions, helium, oxygen, fluorine ions, or a combination thereof may be implanted in the above regions 9 and 10 so that the high-resistivity and n-type regions will be formed similarly.

The GaAs substrate 1 and InGaP buffer layer 2 that lie directly under the HBTs and their intrinsic regions are removed. In consequence, an emitter electrode 15 is formed in contact with the heavily-doped, n-type InGaAs sub-emitter layer 3 just under the HBTs. For the HBTs with the collectors up of Embodiment 1, wherein the collector size is $2 \times 20$ $\mu$m$^2$, the common emitter current-voltage characteristics are shown in FIG. 33. As the result of forming the emitter electrode directly under the HBT-intrinsic regions, decrease in the emitter resistance was found. As the knee voltage defined at current density $2 \times 10^4$ A/cm$^2$, 0.12 V was measured which is lower than the minimum nee voltage of 0.15 V obtained by previous techniques.

Figure 2:
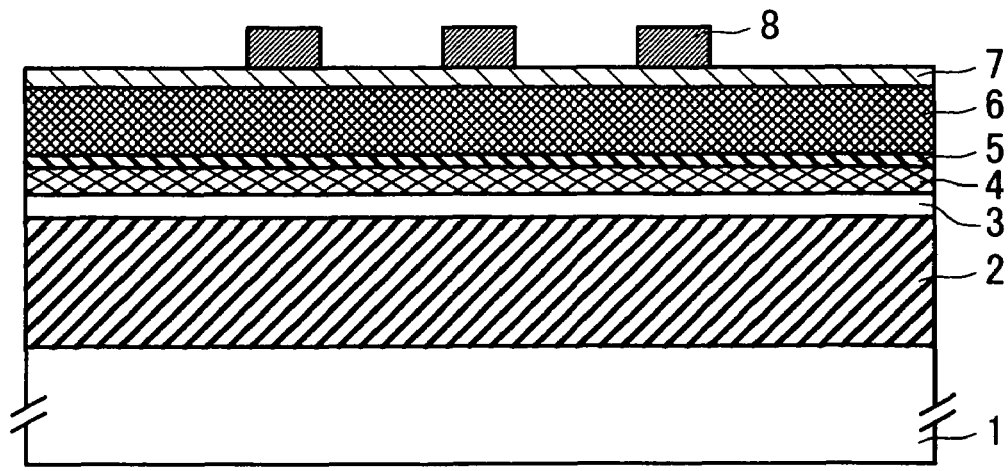
FIG. 2 is a vertical sectional view representing the structure of a semiconductor device using HBTs with the collectors up, which is a preferred Embodiment 1 of the present invention.
Figure 3:
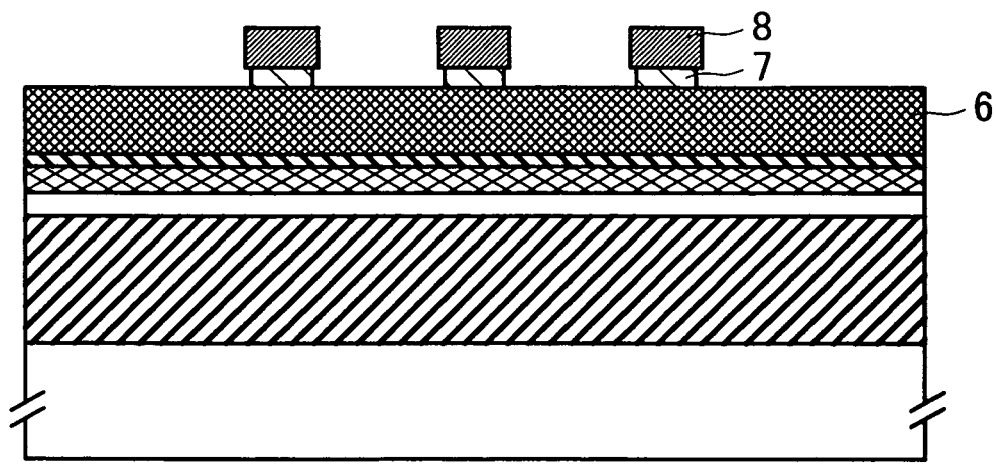
FIG. 3 is a vertical sectional view representing the structure of a semiconductor device using HBTs with the collectors up, which is a preferred Embodiment 1 of the present invention.
Figure 4:
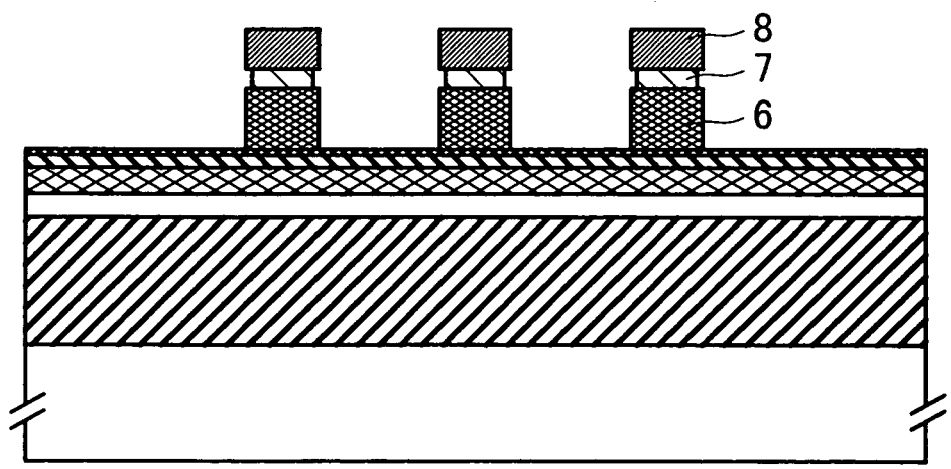
FIG. 4 is a vertical sectional view representing the structure of a semiconductor device using HBTs with the collectors up, which is a preferred Embodiment 1 of the present invention.

Referring to FIGS. 2 to 15, the procedure of fabricating the HBTs with the collectors up shown in FIG. 1 will be explained below. First, using metalorganic chemical vapor deposition or molecular beam epitaxy, on the semi-insulating GaAs substrate 1, the InGaP buffer layer 2, heavily-doped, n-type InGaAs sub-emitter layer 3, n-type InAlAs emitter layer 4, p-type GaAsSb base layer 5, n-type InP collector layer 6, n-type InGaAs cap layer 7 were epitaxially grown in sequence. Then, using RF (radio frequency) sputtering, WSi (The Si mole fraction being 0.3 and 0.3 $\mu$m thick) was deposited over the wafer and the collector electrodes 8 were formed by photolithography and dry etching with CF$_4$ (FIG. 2). Using the collector electrodes 8 as masks, n-type InGaAs cap layers 7 were wet-etched in a solution of mixture of phosphoric acid, hydrogen peroxide, and water, and they were undercut 0.3 $\mu$m (FIG. 3). Next, n-type InP collector layers 6 were etched 0.7 $\mu$m by dry etching with CH$_4$ and Cl$_2$ (FIG. 4).

Figure 5:
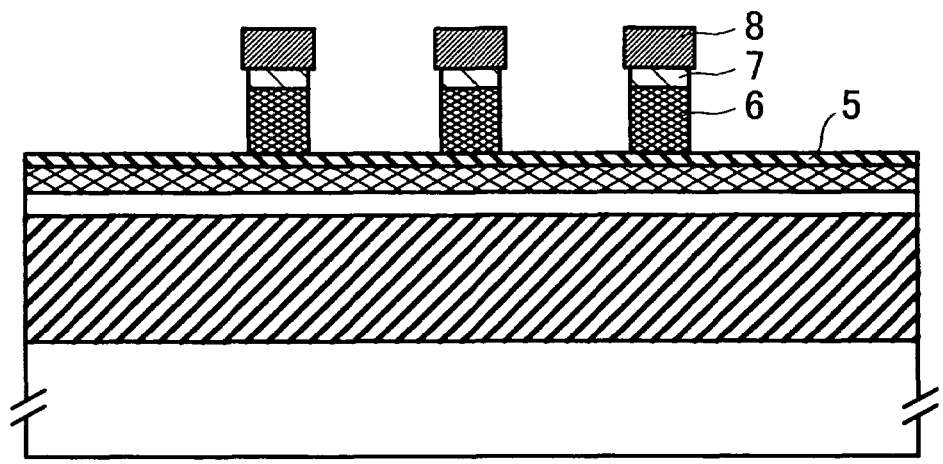
FIG. 5 is a vertical sectional view representing the structure of a semiconductor device using HBTs with the collectors up, which is a preferred Embodiment 1 of the present invention.

Then, the n-type InP collector layers 6 were removed in part by wet etching in a hydrochloric acid solution (FIG. 5). At this time, the p-type GaAsSb layer 5 was not etched in the hydrochloric acid solution and its surface was exposed. The n-type InP collector layers 6 were undercut about 0.3 $\mu$m wide so as to be flush with the wet-etched sides of the n-type InGaAs cap layers 7.

Figure 6:
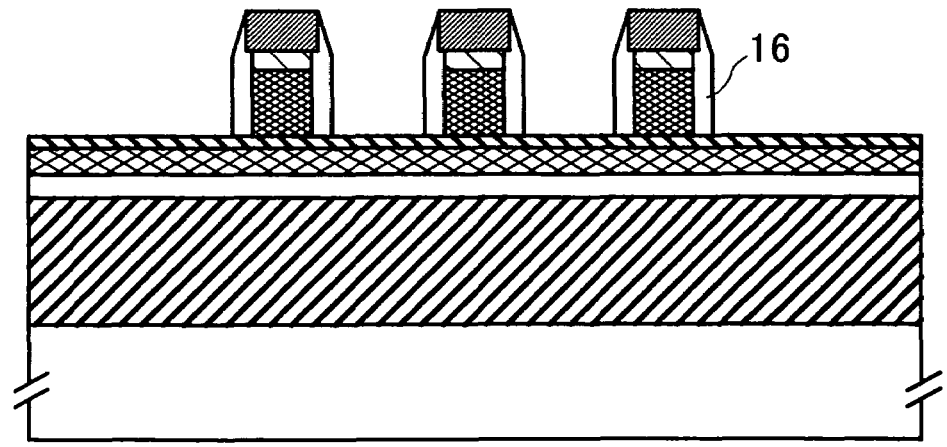
FIG. 6 is a vertical sectional view representing the structure of a semiconductor device using HBTs with the collectors up, which is a preferred Embodiment 1 of the present invention.
Figure 7:
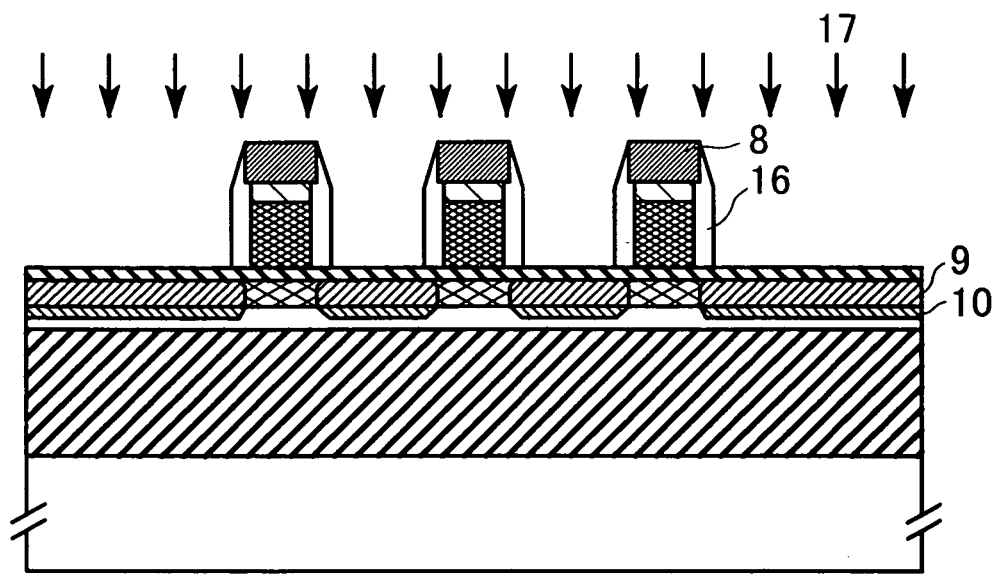
FIG. 7 is a vertical sectional view representing the structure of a semiconductor device using HBTs with the collectors up, which is a preferred Embodiment 1 of the present invention.

Next, using thermal CVD (chemical vapor deposition), a film of SiO$_2$ (400 nm thick) was deposited at 390° C. and SiO$_x$ sidewalls 16 were formed by dry etching with C$_2$F$_6$ and CHF$_3$ (FIG. 6). Using the collector electrodes 8 and SiO$_2$ sidewalls 16 as masks, boron ions 17 were then implanted at room temperature under the conditions of acceleration energy being 50 keV, the incident angle of 0 degree, and a dose of $2 \times 10^{12}$ cm$^{-2}$. At this time, crystalline defects made by the ion implantation laterally diffused and the high-resistivity InAlAs extrinsic emitter region 9 laterally spread (FIG. 7). This spread width further extends through heat processing in a later fabrication process and it was estimated to be 0.3–0.5 $\mu$m wide after the completion of the element fabrication process from the dependency of the collector current on the collector mesa size. The n-type InGaAs extrinsic sub-emitter region 10 also laterally spreads as the high-resistivity InAlAs extrinsic emitter region 9 does. InGaAs, however, does not have high resistivity due to the ion implantation and remains as the conductive n-type. Accordingly, the n-type InGaAs extrinsic sub-emitter region 10 did not affect the operation of the HBTs at all.

Figure 8:
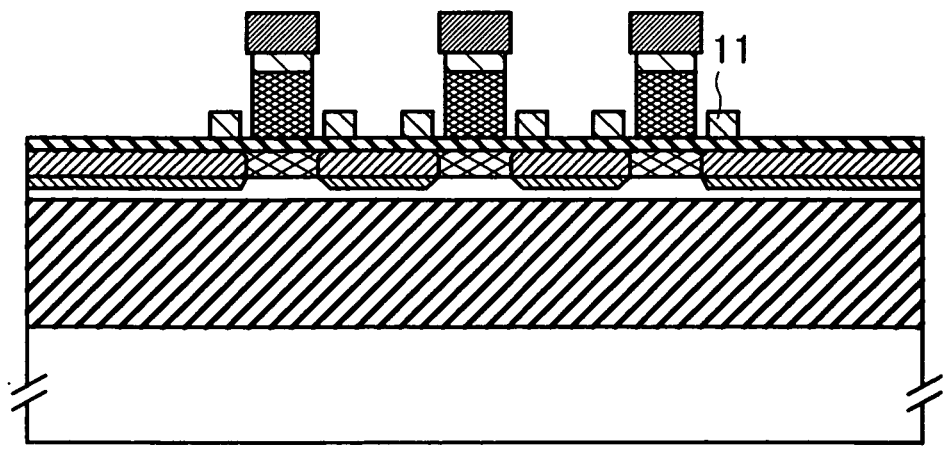
FIG. 8 is a vertical sectional view representing the structure of a semiconductor device using HBTs with the collectors up, which is a preferred Embodiment 1 of the present invention.

Using a hydrofluoric acid solution, the SiO$_2$ sidewalls 16 were then removed. Base electrodes Pt (20 nm)/Ti (50 nm)/Pt (50 nm)/Au (200 nm)/Mo (20 nm) 11 were formed by electron-beam evaporation, using a liftoff technique (FIG. 8).

Figure 9:
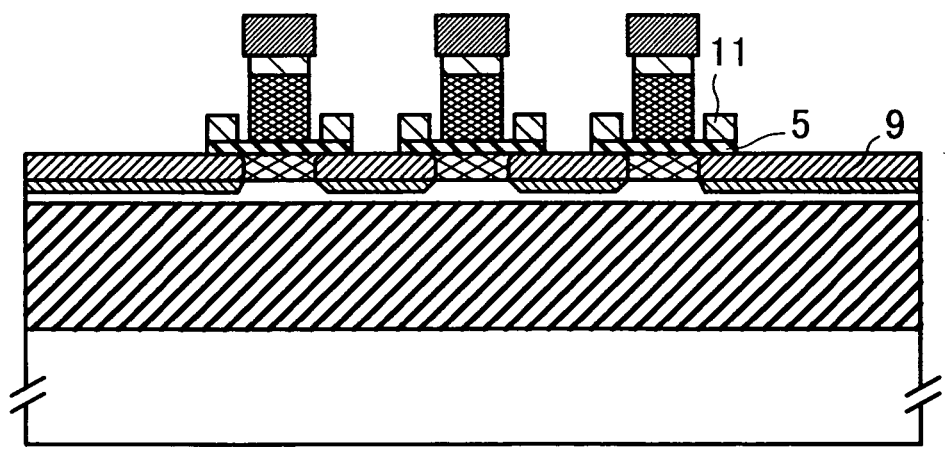
FIG. 9 is a vertical sectional view representing the structure of a semiconductor device using HBTs with the collectors up, which is a preferred Embodiment 1 of the present invention.
Figure 10:
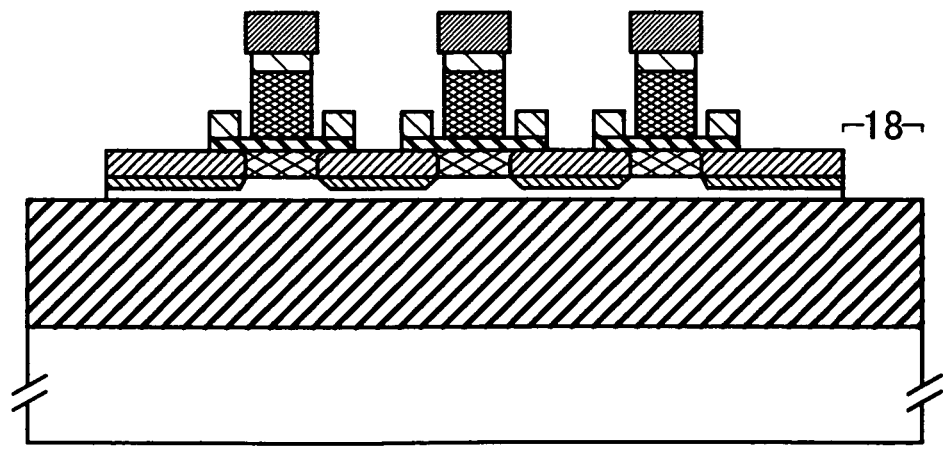
FIG. 10 is a vertical sectional view representing the structure of a semiconductor device using HBTs with the collectors up, which is a preferred Embodiment 1 of the present invention.

Using photolithography and Argon-ion milling, the p-type GaAsSb base layer 5 was then removed in large part, using the base electrodes 11 as masks, so that the high-resistivity InAlAs extrinsic emitter region 9 was exposed (FIG. 9). Using photolithography and wet etching in a solution of mixture of phosphoric acid, hydrogen peroxide, and water, the sub-emitter layer 3 in element separation regions 18 was removed, so that the surface of the buffer layer 2 was exposed (FIG. 10).

Then, a film of SiO$_2$ (0.5 $\mu$m thick) 13 was deposited by plasma-enhanced CVD (chemical vapor deposition) at 250° C. and base contact holes for connecting the base electrodes to wiring were made. Mo (0.15 $\mu$m thick)/Au (0.8 $\mu$m thick)/Mo (0.15 $\mu$m thick) were deposited over the wafer as first wiring metal. On this metal film, base wiring was performed by photolithography and argon-ion milling (the base wiring is not shown because it spreads out horizontally on the surface, extending to the HBT-extrinsic regions).

Figure 11:
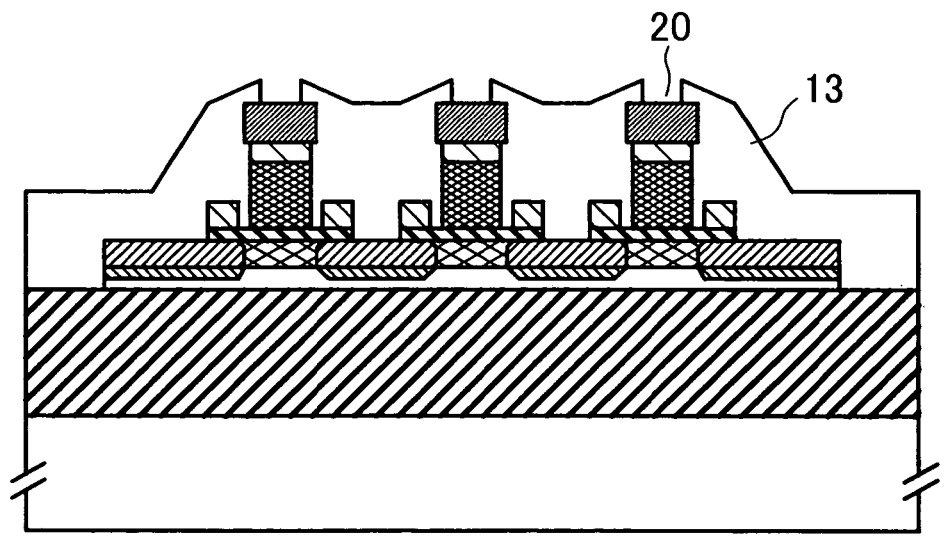
FIG. 11 is a vertical sectional view representing the structure of a semiconductor device using HBTs with the collectors up, which is a preferred Embodiment 1 of the present invention.

Again, a film of $SiO_2$ (0.5 μm thick) 13 was deposited by plasma-enhanced CVD (chemical vapor deposition) at 250° C. and collector contact holes 20 for connecting the collector electrodes 8 to wiring were made (FIG. 11).

Figure 12:
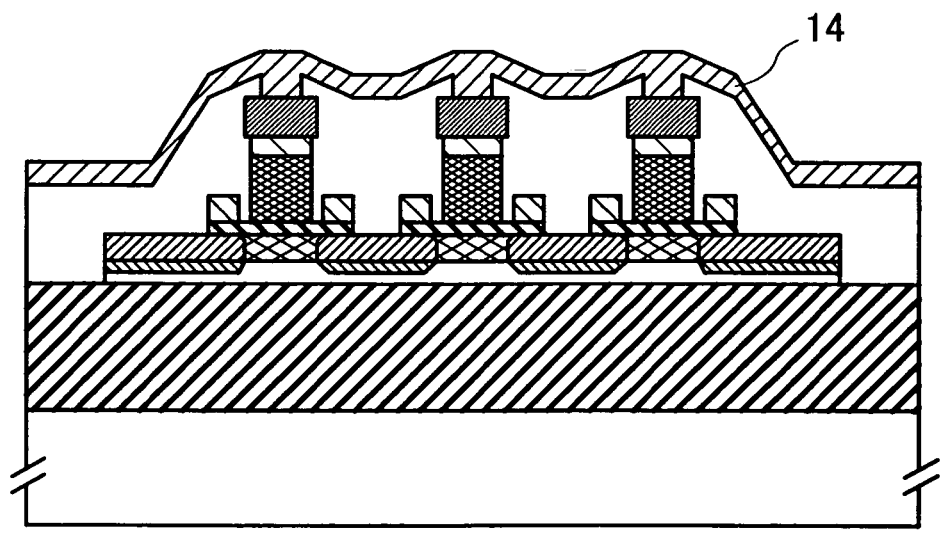
FIG. 12 is a vertical sectional view representing the structure of a semiconductor device using HBTs with the collectors up, which is a preferred Embodiment 1 of the present invention.

Next, Mo (0.15 μm thick)/Au (0.8 μm thick) were deposited over the wafer surface as second wiring metal. On this metal film, collector wiring 14 was formed by photolithography and argon-ion milling (FIG. 12).

Figure 13:
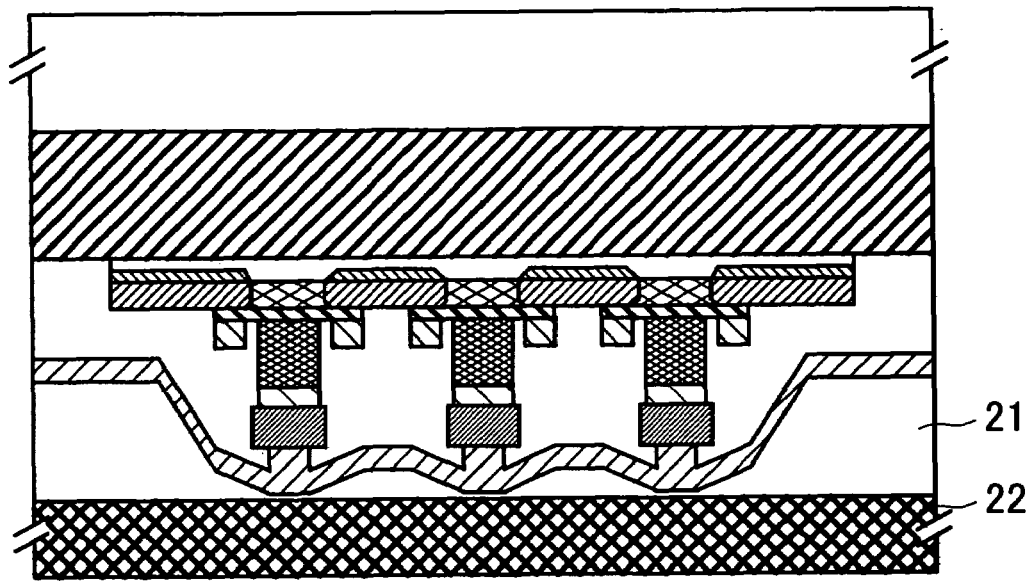
FIG. 13 is a vertical sectional view representing the structure of a semiconductor device using HBTs with the collectors up, which is a preferred Embodiment 1 of the present invention.
Figure 14:
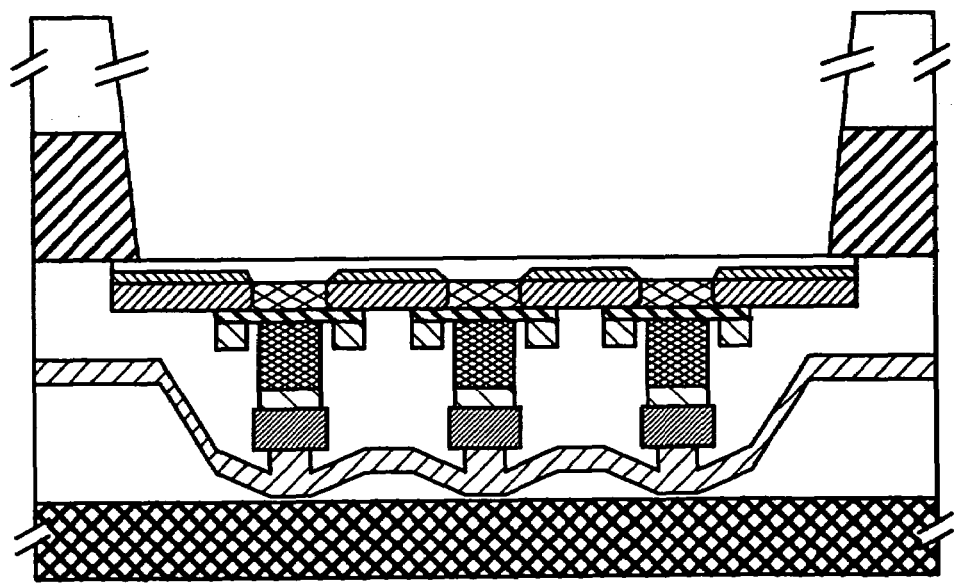
FIG. 14 is a vertical sectional view representing the structure of a semiconductor device using HBTs with the collectors up, which is a preferred Embodiment 1 of the present invention.

Adhesive 21 was then applied on the wafer surface and the wafer was bonded to a glass substrate 22 (FIG. 13). After hardening the adhesive by heating at 120° C., the GaAs substrate 1 was thinned down to 80 μm. The GaAs substrate was then removed to an extent covering the HBT-intrinsic regions by photolithography and dry etching with a gas mixture of $SF_6$ and $SiCl_4$. At this time, dry etching terminated at the bottom surface of the InGaP buffer layer 2. The InGaP buffer layer 2 was then removed by wet etching in a hydrochloric acid solution, so that the bottom surface of the InGaAs sub-emitter layer 3 was exposed (FIG. 14).

Figure 15:
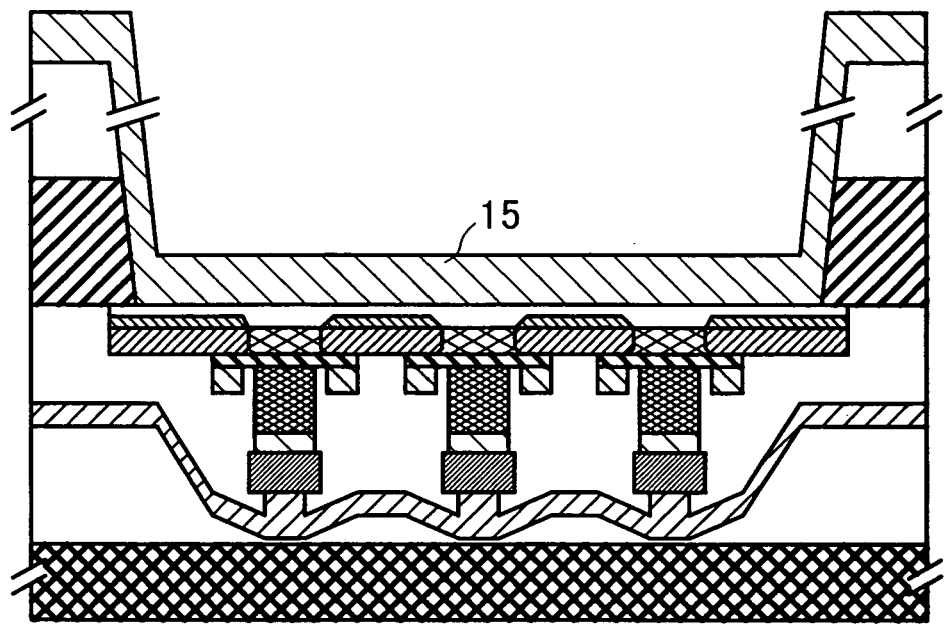
FIG. 15 is a vertical sectional view representing the structure of a semiconductor device using HBTs with the collectors up, which is a preferred Embodiment 1 of the present invention.

Finally, Ti (50 nm thick)/Pt (50 nm thick)/Au (300 nm thick) were sputter-deposited and a backside emitter electrode 15 was deposited by Au plating (3 μm thick) (FIG. 15). Adhesive 21 was removed and fabricating the HBTs with the collectors up (FIG. 1) finished.

According to Embodiment 1, the GaAs substrate that is less costly and can be made to have a large diameter is used and HBTs with the GaAsSb base layer are fabricated, for which $V_{BE}$=0.6 V. The buffer layer to absorb dislocation due to lattice-mismatch intervenes between the HBTs and the substrate. The GaAs substrate and the buffer layer of high thermal resistivity that lie directly under the HBT-intrinsic regions for transistor operation are removed. The HBTs are fabricated in collector-up configurations. The intrinsic emitters that contribute to transistor operation are made of InAlAs and the extrinsic emitters that do not contribute to transistor operation are made of InAlAs including at least one of elements He, B, O, and F. Furthermore, the emitter electrode of the HBTs was formed so as to cover the back surface of the HBTs device. The thus fabricated semiconductor device is effective for making it possible to provide HBTs adequate for a power amplifier that can operate with a power supply voltage of 2 V or below and features high power conversion efficiency and a semiconductor device using the HBTs, free of reliability problems and at reduced cost.

Embodiment 2

Figure 16:
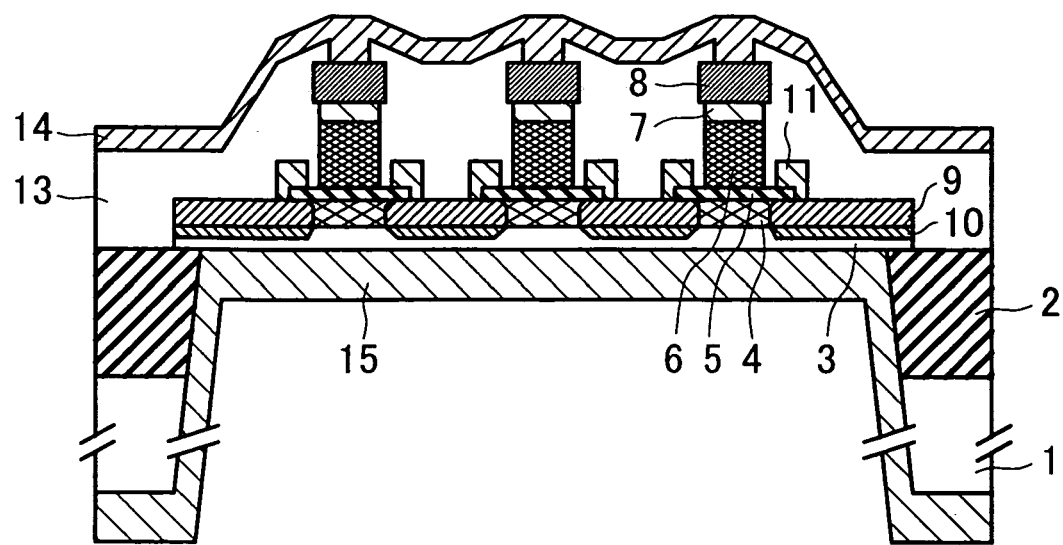
FIG. 16 is a vertical sectional view representing the structure of a semiconductor device using HBTs with the collectors up, which is a preferred Embodiment 2 of the present invention.

FIG. 16 is a vertical sectional view representing the structure of a semiconductor device using HBTs with the collectors up, used for a power amplifier, as a preferred Embodiment 2 of the present invention. Difference from the HBTs with the collectors up (FIG. 1) of Embodiment 1 lies in that the base layers 5 are heavily-doped, p-type InGaAs (the InAs mole fraction being 0.5, the C concentration being $3 \times 10^{19}$ $cm^{-3}$, and 70 nm thick) and that each base electrode 11 is formed in contact with the top surface and side of its base layer 5 and the surface of its adjacent extrinsic emitter area 9. Referring to FIGS. 17 to 26, the procedure of fabricating the HBTs with the collectors up shown in FIG. 16 will be explained below.

The epitaxial growth of the layers is the same as in Embodiment 1 except that the heavily-doped InGaAs base layer 5 is used instead of the heavily-doped GaAsSb layer in Embodiment 1. The procedure from depositing the collector electrodes and forming the collector mesa is the same as in Embodiment 1 and its explanation will not be repeated.

Figure 17:
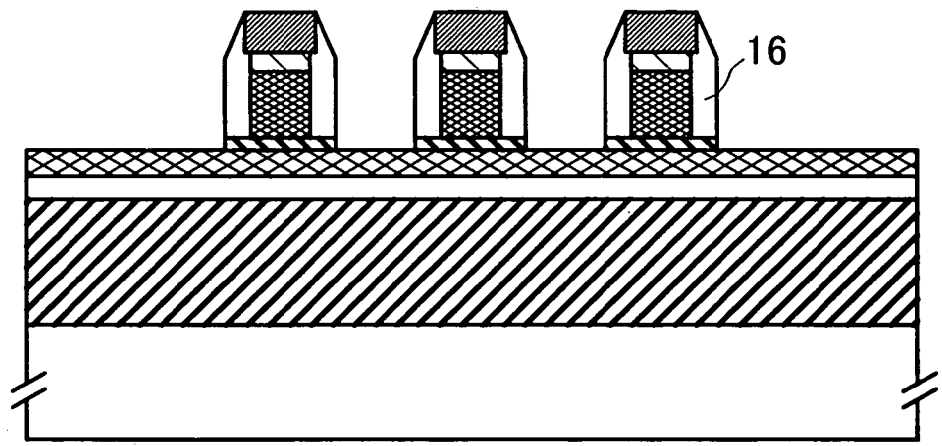
FIG. 17 is a vertical sectional view representing the structure of a semiconductor device using HBTs with the collectors up, which is a preferred Embodiment 2 of the present invention.

After forming the collector mesa, using thermal CVD (chemical vapor deposition), a film of $SiO_2$ (400 nm thick) was deposited at 390° C. and $SiO_2$ sidewalls 16 were formed by dry etching with $C_2F_6$ and $CHF_3$. Using the collector electrodes 8 and $SiO_2$ sidewalls 16 as masks, the base layers 5 were etched by wet etching in a solution of mixture of phosphoric acid, hydrogen peroxide, and water. This state is shown in FIG. 17.

Figure 18:
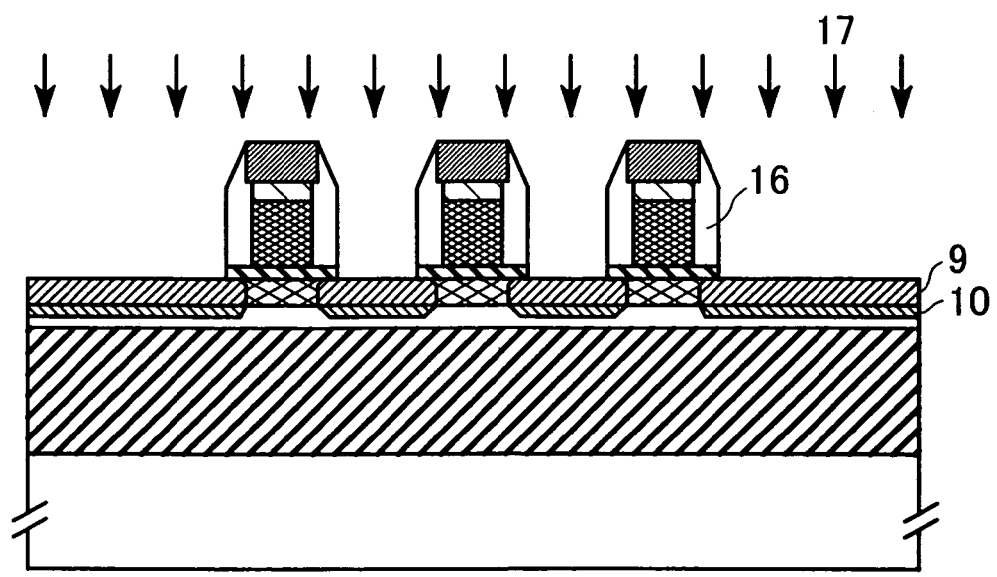
FIG. 18 is a vertical sectional view representing the structure of a semiconductor device using HBTs with the collectors up, which is a preferred Embodiment 2 of the present invention.

Using the collector electrodes 8 and $SiO_2$ sidewalls 16 as masks, boron ions 17 were then implanted at room temperature under the conditions of acceleration energy being 50 keV, the incident angle of 0 degree, and a dose of $2 \times 10^{12}$ $cm^{-2}$. At this time, crystalline defects made by the ion implantation laterally diffused and the high-resistivity InAlAs extrinsic emitter region 9 laterally spread (FIG. 18).

This spread width further extends through heat processing in a later fabrication process and it was estimated to be 0.3–0.5 μm wide after the completion of the element fabrication process from the dependency of the collector current on the collector mesa size. As is the case in Embodiment 1, the n-type InGaAs extrinsic sub-emitter region 10 also laterally spreads as the high-resistivity InAlAs extrinsic emitter region 9 does. InGaAs, however, does not have high resistivity due to the ion implantation and remains as the conductive n-type. Accordingly, the n-type InGaAs extrinsic sub-emitter region 10 did not affect the operation of the HBTs at all.

Figure 19:
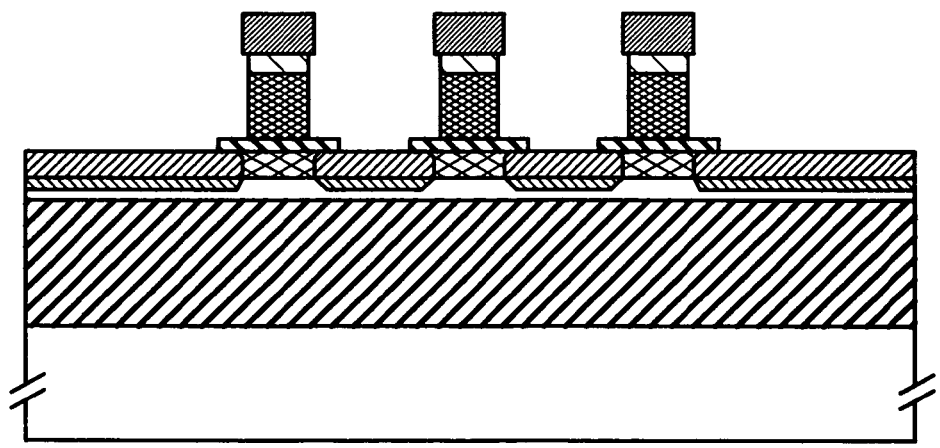
FIG. 19 is a vertical sectional view representing the structure of a semiconductor device using HBTs with the collectors up, which is a preferred Embodiment 2 of the present invention.
Figure 20:
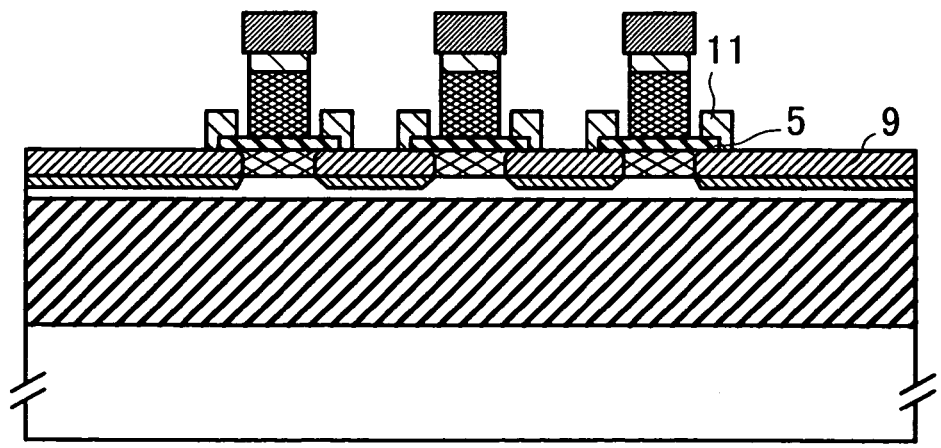
FIG. 20 is a vertical sectional view representing the structure of a semiconductor device using HBTs with the collectors up, which is a preferred Embodiment 2 of the present invention.

Using a hydrofluoric acid solution, the $SiO_2$ sidewalls 16 were then removed (FIG. 19). Base electrodes Pt (20 nm)/Ti (50 nm)/Pt (50 nm)/Au (200 nm)/Mo (20 nm) 11 were formed by electron-beam evaporation, using the liftoff technique, each base electrode contacting with the surface and side of its base layer and the surface of the adjacent the high-resistivity InAlAs extrinsic emitter region 9 (FIG. 20).

Figure 21:
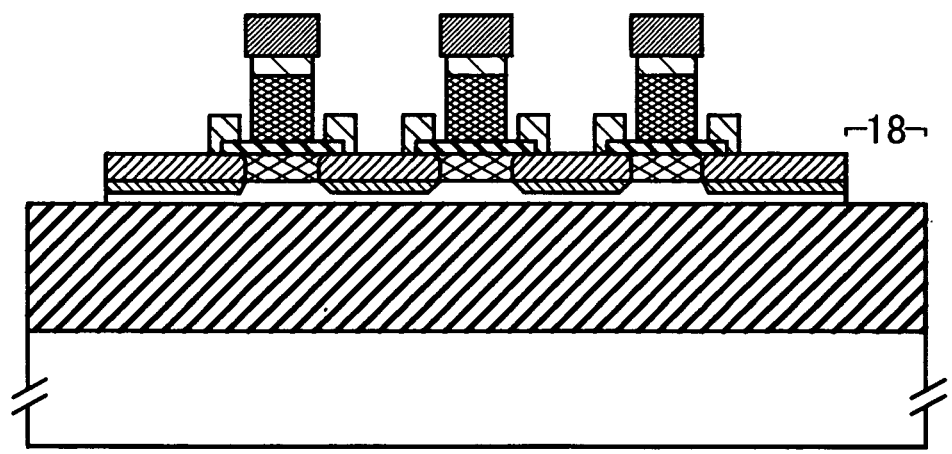
FIG. 21 is a vertical sectional view representing the structure of a semiconductor device using HBTs with the collectors up, which is a preferred Embodiment 2 of the present invention.

Using photolithography and wet etching in a solution of mixture of phosphoric acid, hydrogen peroxide, and water, the sub-emitter layer 3 in element separation regions 18 was removed, so that the surface of the buffer layer 2 was exposed (FIG. 21).

Figure 22:
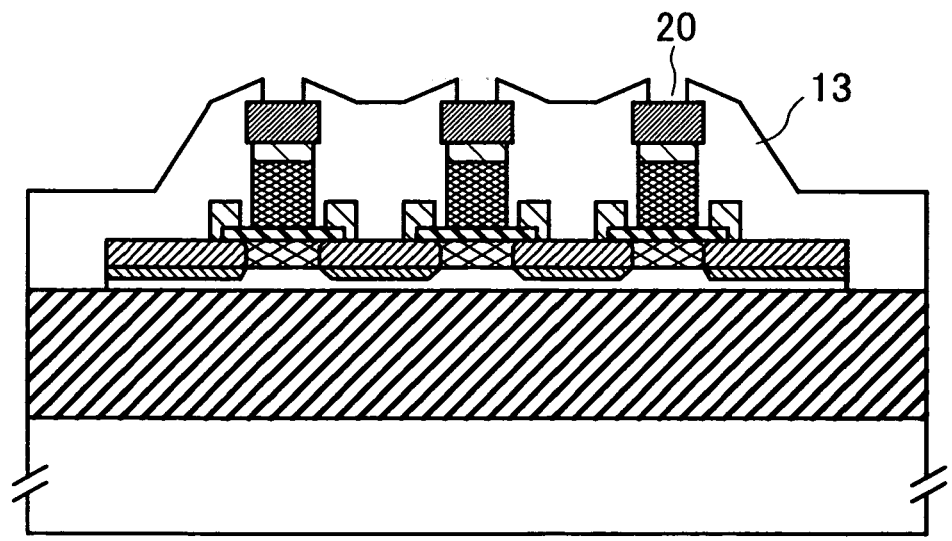
FIG. 22 is a vertical sectional view representing the structure of a semiconductor device using HBTs with the collectors up, which is a preferred Embodiment 2 of the present invention.

Then, a film of $SiO_2$ (0.5 μm thick) 13 was deposited by plasma-enhanced CVD (chemical vapor deposition) at 250° C. and base contact holes for connecting the base electrodes to wiring were made. Mo (0.15 μm thick)/Au (0.8 μm thick)/Mo (0.15 μm thick) were deposited over the wafer surface as first wiring metal. On this metal film, base wiring was performed by photolithography and argon-ion milling (the base wiring is not shown because it spreads out horizontally on the surface, extending to the HBT-extrinsic regions). Again, a film of $SiO_2$ (0.5 μm thick) 13 was deposited by plasma-enhanced CVD (chemical vapor deposition) at 250° C. and collector contact holes 20 for connecting the collector electrodes 8 to wiring were made (FIG. 22).

Figure 23:
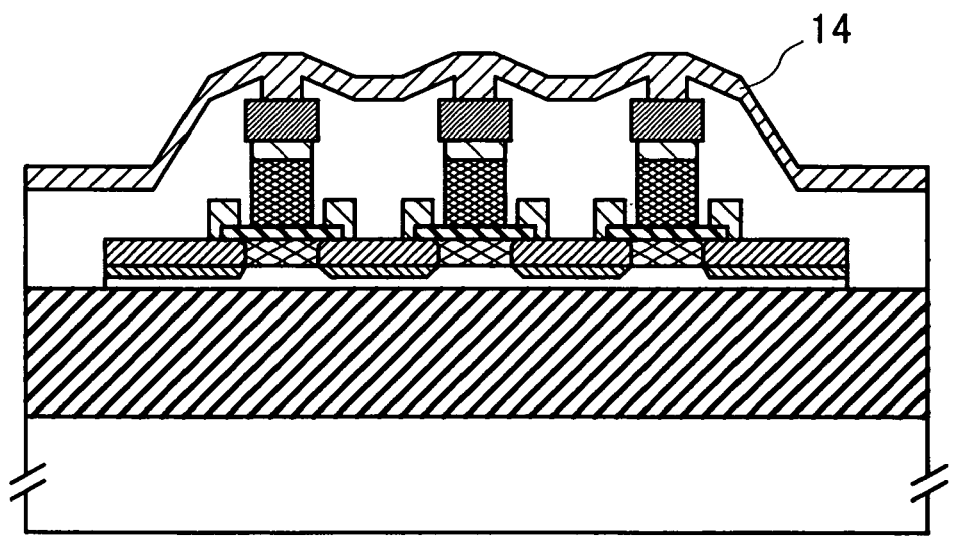
FIG. 23 is a vertical sectional view representing the structure of a semiconductor device using HBTs with the collectors up, which is a preferred Embodiment 2 of the present invention.

Next, Mo (0.15 μm thick)/Au (0.8 μm thick) were deposited over the wafer surface as second wiring metal. On this metal film, collector wiring 14 was formed by photolithography and argon-ion milling (FIG. 23).

Figure 24:
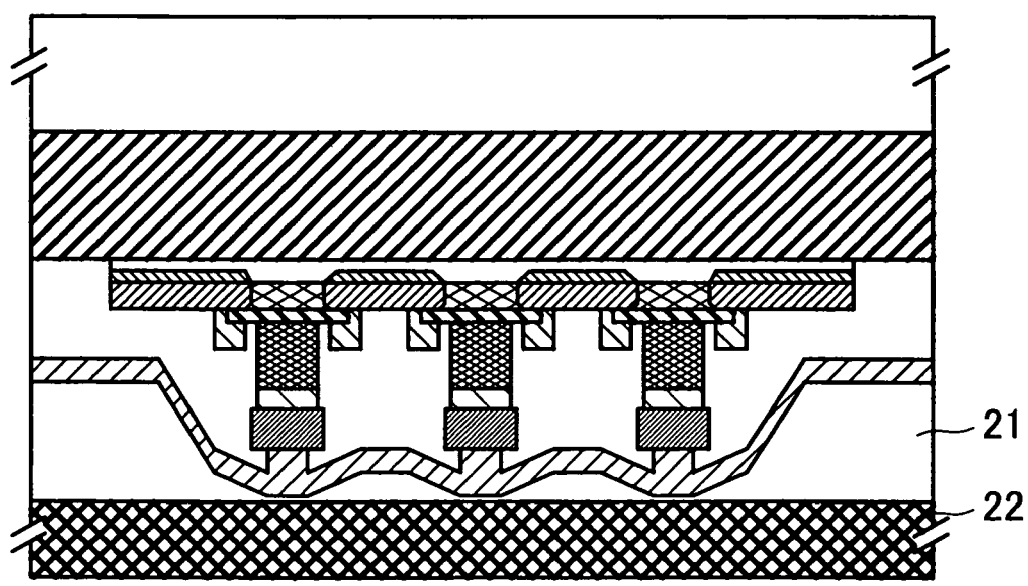
FIG. 24 is a vertical sectional view representing the structure of a semiconductor device using HBTs with the collectors up, which is a preferred Embodiment 2 of the present invention.
Figure 25:
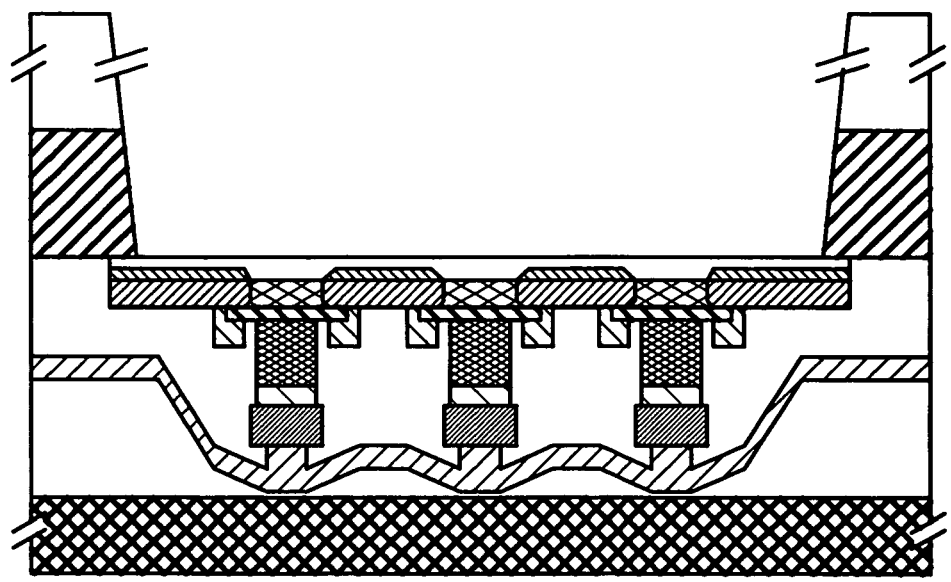
FIG. 25 is a vertical sectional view representing the structure of a semiconductor device using HBTs with the collectors up, which is a preferred Embodiment 2 of the present invention.

Adhesive 21 was then applied on the wafer surface and the wafer was bonded to a glass substrate 22 (FIG. 24). After hardening the adhesive by heating at 120° C., the GaAs substrate 1 was thinned down to 80 μm. The GaAs substrate was then removed to an extent covering the HBT-intrinsic regions by photolithography and dry etching with a gas mixture of $SF_6$ and $SiCl_4$. At this time, dry etching terminated at the bottom surface of the InGaP buffer layer 2. The InGaP buffer layer 2 was then removed by wet etching in a hydrochloric acid solution, so that the bottom surface of the InGaAs sub-emitter layer 3 was exposed (FIG. 25).

Figure 26:
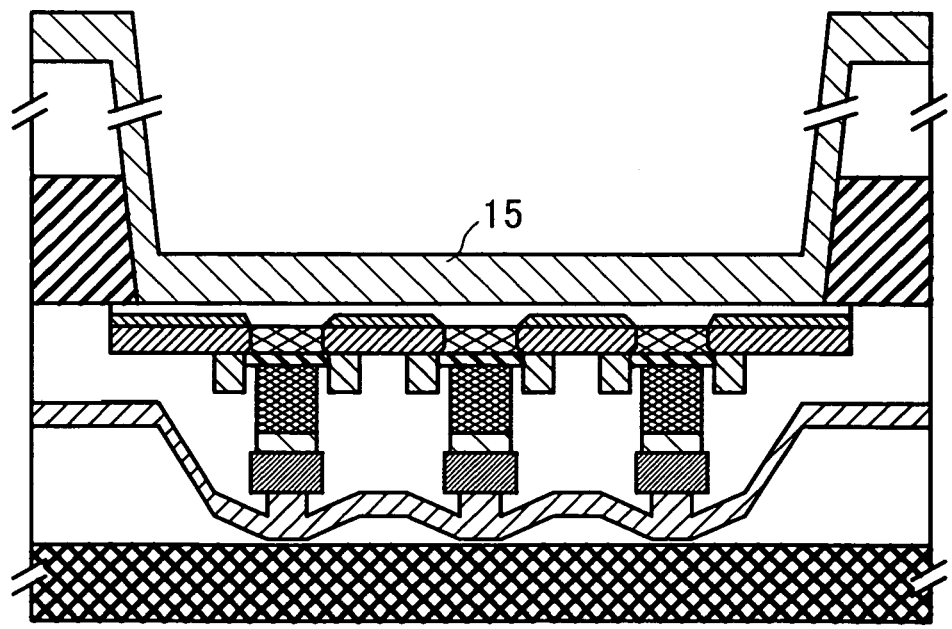
FIG. 26 is a vertical sectional view representing the structure of a semiconductor device using HBTs with the collectors up, which is a preferred Embodiment 2 of the present invention.
Figure 27:
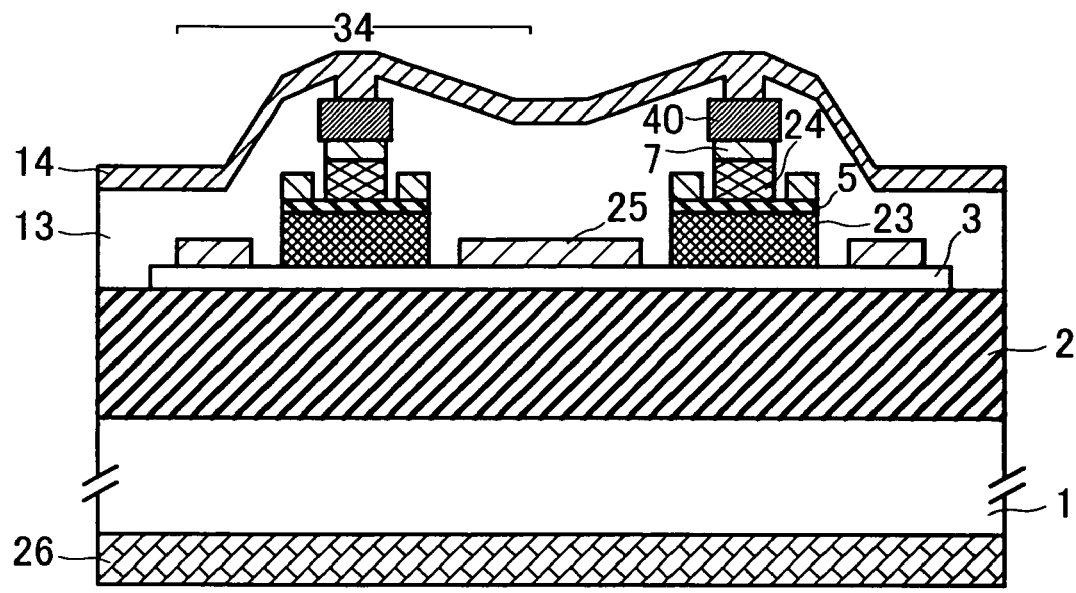
FIG. 27 is a vertical sectional view representing the structure of a semiconductor device using HBTs with the emitters up, which is fabricated by a previous HBT technique.

Finally, Ti (50 nm thick)/Pt (50 nm thick)/Au (200 nm thick) were sputter-deposited and a backside emitter electrode 15 was deposited by Au plating (3 μm thick) (FIG. 26). Adhesive 21 was removed and fabricating the HBTs with the collectors up (FIG. 16) finished.

According to Embodiment 2, the GaAs substrate that is less costly and can be made to have a large diameter is used and HBTs with the GaAsSb base layer are fabricated, for which $V_{BE}$=0.7 V. The buffer layer to absorb dislocation due to lattice-mismatch intervenes between the HBTs and the substrate. The GaAs substrate and the buffer layer of high thermal resistivity that lie directly under the HBT-intrinsic regions for transistor operation are removed. The HBTs are fabricated in collector-up configurations. The intrinsic emitters that contribute to transistor operation are made of InAlAs and the extrinsic emitters that do not contribute to transistor operation are made of InAlAs including at least one of elements He, B, O, and F. Furthermore, the emitter electrode of the HBTs was formed so as to cover the back surface of the HBTs device. The thus fabricated semiconductor device is effective for making it possible to provide HBTs adequate for a power amplifier that can operate with a power supply voltage of 2 V or below and features high power conversion efficiency and a semiconductor device using the HBTs, free of reliability problems and at reduced cost.

While the InGaAs base layers 5 are employed in Embodiment 2, the HBTs of equivalent performance can be fabricated by using the GaAsSb base layers illustrated in Embodiment 1, of course.

Embodiment 3

Using FIG. 28 and FIGS. 30 to 32, a power amplifier module as a preferred Embodiment 3 of the present invention will be described below.

Figure 28:
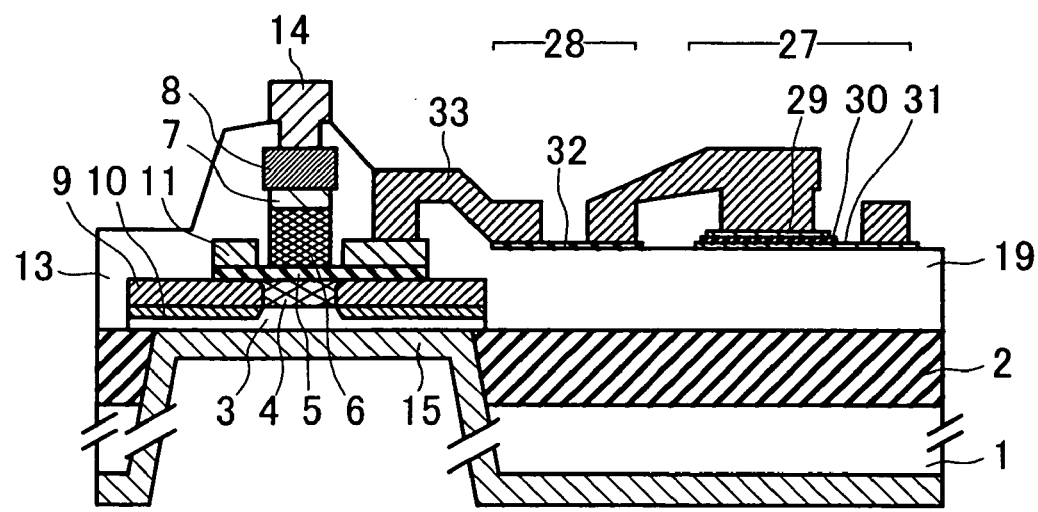
FIG. 28 is a vertical sectional view representing a structure into which an HBT with the collector up, capacitors, and resistors are integrated in a MMIC for a power amplifier module which is a preferred Embodiment 3 of the present invention.
Figure 29:
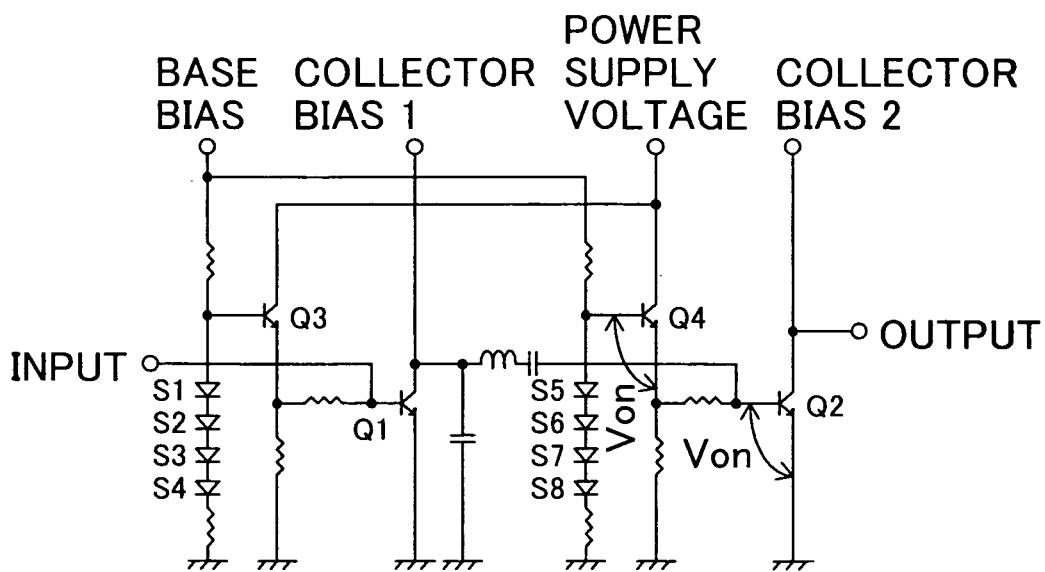
FIG. 29 is a circuit diagram of a power amplifier consisting of two stages of HBTs and bias circuits.
Figure 30:
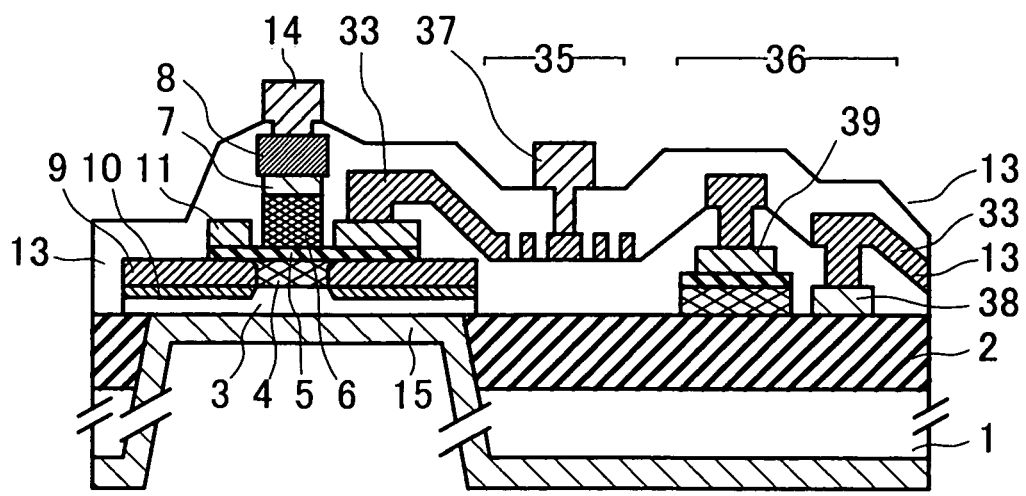
FIG. 30 is a vertical sectional view representing a structure into which an HBT with the collector up, inductors, and Schottky diodes are integrated in the MMIC for the power amplifier module of Embodiment 3 of the present invention.
Figure 31:
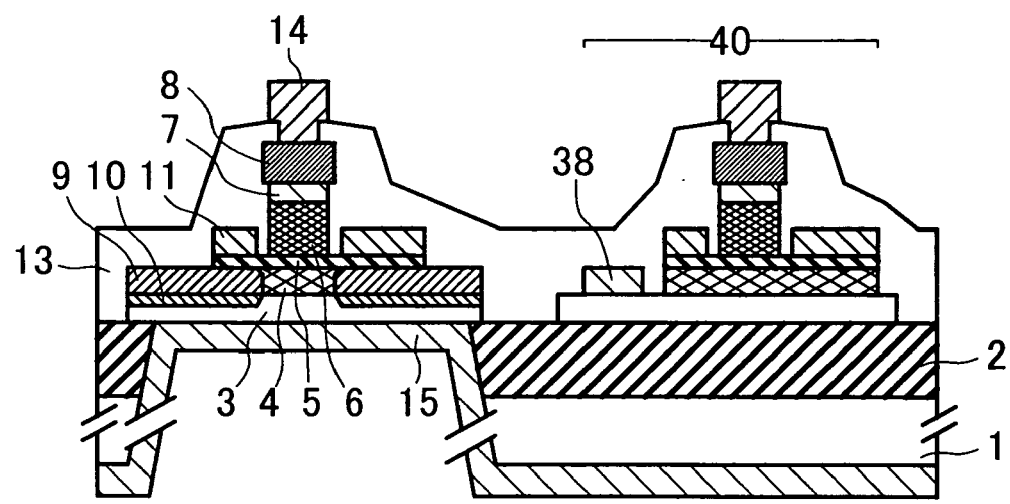
FIG. 31 is a vertical sectional view representing a structure into which an HBT with the collector up and an HBT with emitter up are integrated in the MMIC for the power amplifier module of Embodiment 3 of the present invention.

FIGS. 28, 30, and 31 are vertical sectional views representing the structure of a MMIC using the power amplifier of Embodiment 3. FIG. 28 shows a structure into which one HBT with the collector up illustrated in Embodiment 1, capacitors 27, and resistors 28 were integrated. FIG. 30 shows another structure into which one HBT with the collector up illustrated in Embodiment 1, inductors 35, and Schottky diode 36 were integrated. FIG. 31 shows yet another structure into which one HBT with the collector up illustrated in Embodiment 1 and one HBT with the emitter up 40 were integrated. The MMIC is comprised of part or all of the above active and passive elements installed on the same substrate. For example, in the case of a circuit diagram shown in FIG. 29, Q1 and Q2 are embodied in HBTs with the collectors up and Q3 and Q4 in HBTs with the emitters up. It is desirable that Schottky diodes S1 and S8 shown in FIG. 29 are embodied in Schottky diodes 36 in view of compactness of the power amplifier module. Diodes S1 and S8 and transistors Q3 and Q4 may be embodied in Si or SiGe Schottky diodes and Si bipolar transistors or SiGe HBTs which are made of different material from the material of the above HBT with the collector up on a chip separate from the MMIC chip on which a power amplifier is constructed with the Q1 and Q2 HBTs.

The capacitors 27 consist of an upper electrode 29, a $SiO_2/Si_3N_4/SiO_2$ laminated film 30, and a lower electrode 31. The resistors 28 consist of a WSiN resistive film 32 and a first wiring layer 33. The inductors 35 consist of the first wiring layer 33 and a second wiring layer 37. The Schottky diode 36 makes use of the GaAsSb (or InGaAs) base layer 5, InAlAs emitter layer 4, and InGaAs sub-emitter layer 3 of the HBT with the collector up, with its n-electrode 38 and p-electrode 39 being formed on the sub-emitter layer 3 and base layer 5 respectively. The HBT with the emitter up uses the epitaxially grown collector, emitter, and sub-emitter layers of the HBT with the collector up as its emitter, collector, and sub-collector layers, respectively. The Wsi collector electrode 8 formed on the top of the cap layer of the HBT with the collector up is used as the emitter electrode of the HBT with the emitter up. The collector electrode 38, together with the n-electrode of the Schottky diode, is formed by depositing Ti (50 nm thick) /Pt (50 nm thick)/Au (200 nm thick) on the sub-emitter layer 3, using the liftoff technique.

Figure 32:
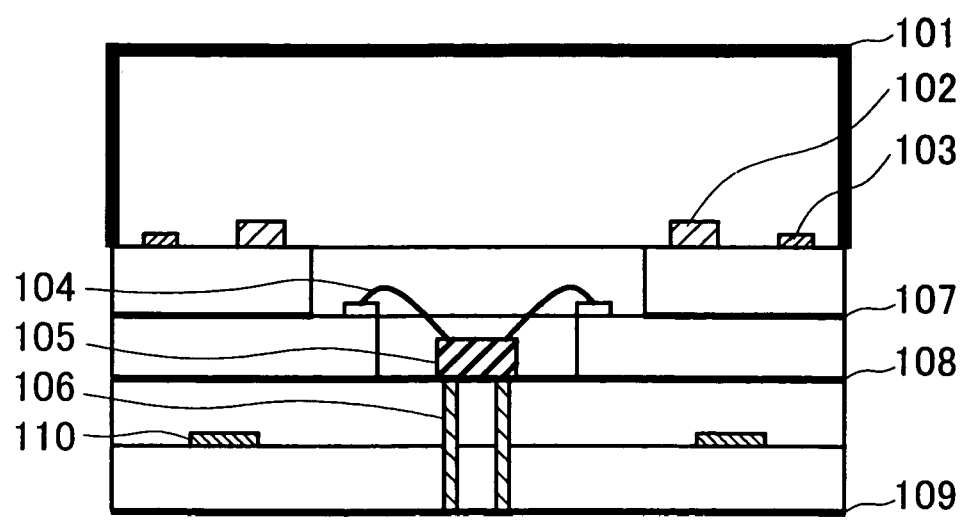
FIG. 32 is a vertical sectional view representing the structure of the power amplifier module of Embodiment 3 of the present invention.

FIG. 32 represents a power amplifier module package wherein a low-temperature fired glass ceramic substrate with a relative dielectric constant of 8 is employed. Reference numeral 101 denotes a metal cap, 203 denotes a chip component. Reference numeral 103 denotes a transmission line that is formed by thick-film screen print of an Ag and Pt laminated film. Reference numeral 105 denotes the above-described MMIC with its back surface electrically connected to a ground layer 108 by Ag paste. On the top surface of the MMIC 105, electrode pads for input and output are placed with wire bonds 104 for leads extending outside the chip. Reference numeral 106 denotes a thermal via and numerals 107 and 109 are other ground layers besides the ground layer 108.

According to Embodiment 3, high-reliability and low-cost HBTs that can operate with a power supply voltage of 2V or below are used in the MMIC for the power amplifier module. Its effect is making it possible to provide a power amplifier that operates with a power supply voltage of 2 V or below and features high power conversion efficiency, free of reliability problems and at reduced cost.

According to the present invention, a semiconductor device using HBTs that can operate with a power supply voltage of 2V or below can be provided at reduced cost as a well-reliable product, and a power amplifier with high power conversion efficiency can be provided.

What is claimed is:

1. A method of fabricating a semiconductor device comprising a plurality of heterojunction bipolar transistors with their base layer made of GaAsSb or InGaAs, a GaAs substrate, and a buffer layer placed between the base layer and the substrate, the method including a process in which the GaAs substrate is removed to an extent covering the intrinsic regions of the plurality of heterojunction bipolar transistors by photolithography and dry etching and the buffer layer is then removed to the same extent.

2. A method of fabricating a semiconductor device as recited in claim 1, further including a process in which an emitter electrode is formed so as to cover the back surface of the semiconductor device, following said process.

* * * * *